United States Patent
Wieser et al.

(10) Patent No.: US 8,803,071 B2
(45) Date of Patent: Aug. 12, 2014

(54) HOUSING FOR AN OPTICAL SENSOR WITH MICRO-WINDOWS AND A LIGHT VALVE TO PREVENT REFLECTED LIGHT FROM ESCAPING

(75) Inventors: Ralf Wieser, Beimerstetten (DE); Somakanthan Somalingam, Ulm (DE); Max Lindfors, Espoo (FI)

(73) Assignee: Nokia Corporation, Espoo (FI)

( * ) Notice: Subject to any disclaimer, the term of this patent is extended or adjusted under 35 U.S.C. 154(b) by 146 days.

(21) Appl. No.: 13/285,585

(22) Filed: Oct. 31, 2011

(65) Prior Publication Data
US 2013/0105676 A1    May 2, 2013

(51) Int. Cl.
| | | |
|---|---|---|
| *H01J 5/16* | (2006.01) | |
| *G02B 27/00* | (2006.01) | |
| *G06M 7/00* | (2006.01) | |
| *G01J 1/44* | (2006.01) | |

(52) U.S. Cl.
USPC ...... 250/239; 250/551; 250/221; 250/214 AL

(58) Field of Classification Search
CPC .............. G02F 1/00; G02F 1/29; G02F 1/35; G02F 1/1306; G02F 1/133; G02F 1/0121; G02B 5/30
USPC ........... 250/551, 221, 214 AL, 225, 239, 216, 250/229, 228; 340/539.22, 539.23, 541; 356/3, 3.02, 3.06–3.08, 3.1, 3.11, 3.12, 356/4.01, 4.07, 5.01–5.04, 614, 615, 622, 356/623
See application file for complete search history.

(56) References Cited

U.S. PATENT DOCUMENTS

| | | | | |
|---|---|---|---|---|
| 3,158,675 | A * | 11/1964 | Hanyo et al. ................... | 356/367 |
| 3,215,850 | A * | 11/1965 | Goodman ...................... | 250/551 |
| 3,227,034 | A * | 1/1966 | Shelton, Jr. ................... | 382/212 |
| 4,272,676 | A * | 6/1981 | Dieulesaint et al. .......... | 250/221 |
| 7,411,637 | B2 * | 8/2008 | Weiss .............................. | 349/16 |
| 2009/0040703 | A1 | 2/2009 | Gotham et al. ............... | 361/681 |
| 2010/0245289 | A1 | 9/2010 | Svajda .......................... | 345/175 |
| 2011/0149100 | A1 | 6/2011 | Narabu ..................... | 348/222.1 |
| 2011/0248961 | A1 * | 10/2011 | Svajda et al. ................. | 345/175 |
| 2012/0001841 | A1 | 1/2012 | Gokingco et al. ............ | 345/102 |
| 2012/0129269 | A1 * | 5/2012 | Choi et al. .................... | 436/164 |
| 2012/0170284 | A1 | 7/2012 | Shedletsky .................... | 362/355 |

FOREIGN PATENT DOCUMENTS

EP    1 081 636 A2    3/2001

OTHER PUBLICATIONS

Hecht, E. (2002). Polarization. Optics ($4^{th}$ ed., pp. 331-332). Reading, Mass.: Addison-Wesley.*

* cited by examiner

*Primary Examiner* — Georgia Y Epps
*Assistant Examiner* — Carolynn A Moore
(74) *Attorney, Agent, or Firm* — Harrington & Smith

(57) ABSTRACT

An apparatus including a housing defining at least one interior cavity; at least one optical sensor located within the at least one interior cavity of the housing adjacent a first portion of the housing; wherein the first portion of the housing includes a plurality of distributed optical windows through the housing. A housing part of an apparatus including a housing wall comprising a plurality of distributed micro-windows through the housing wall.

19 Claims, 3 Drawing Sheets

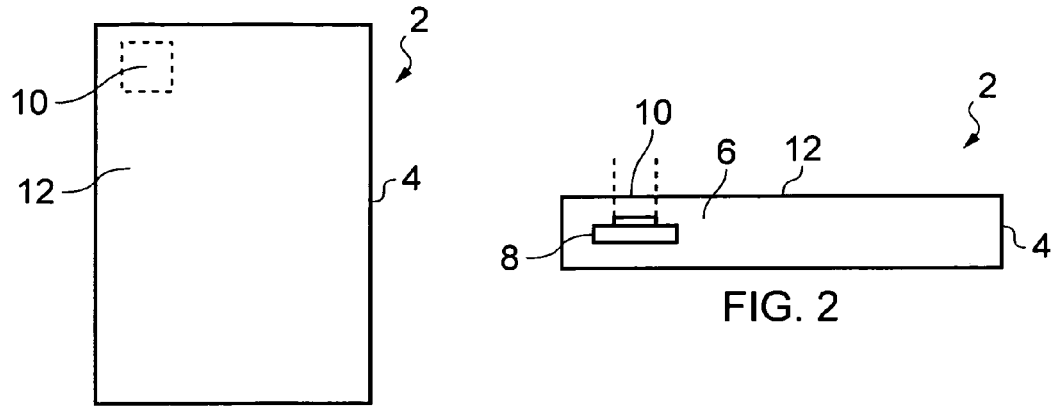
FIG. 1
FIG. 2
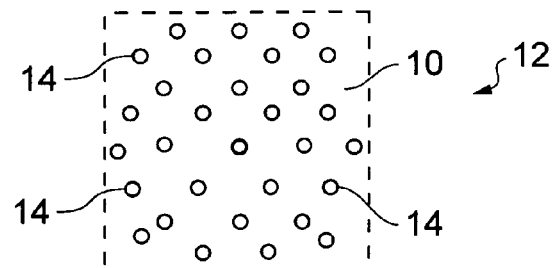
FIG. 3
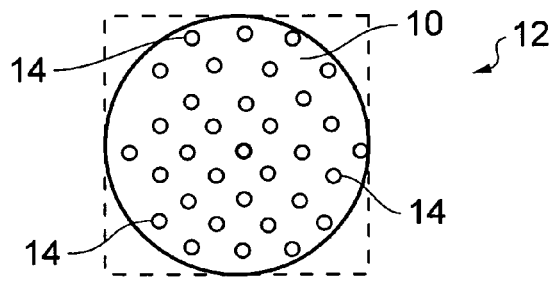
FIG. 4
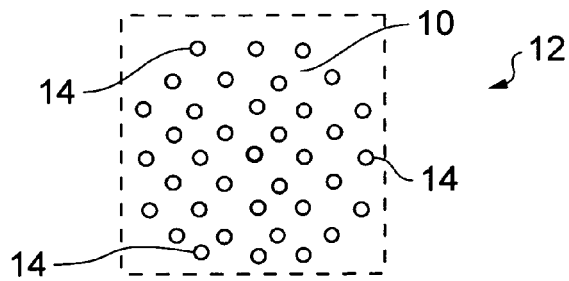
FIG. 5

HOUSING FOR AN OPTICAL SENSOR WITH MICRO-WINDOWS AND A LIGHT VALVE TO PREVENT REFLECTED LIGHT FROM ESCAPING

TECHNOLOGICAL FIELD

Embodiments of the present invention relate to an apparatus comprising an optical sensor and a housing part for an apparatus.

BACKGROUND

Optical sensors are used in a variety of different electronic apparatus.

An optical sensor may, for example, be used as a proximity detector or an ambient light detector.

An optical sensor typically requires an aperture through a housing of the apparatus. If this aperture is transparent, the optical sensor will be visible to a user. If this aperture is made smaller or obscured, the optical sensor may not function properly.

BRIEF SUMMARY

According to various, but not necessarily all, embodiments of the invention there is provided an apparatus comprising: a housing defining at least one interior cavity; at least one optical sensor located within the at least one interior cavity of the housing adjacent a first portion of the housing; wherein the first portion of the housing comprises a plurality of distributed optical windows through the housing.

According to various, but not necessarily all, embodiments of the invention there is provided a housing part of an apparatus comprising: a housing wall comprising a plurality of distributed micro-windows through the housing wall.

BRIEF DESCRIPTION

For a better understanding of various examples of embodiments of the present invention reference will now be made by way of example only to the accompanying drawings in which:

FIG. 1 illustrates, in plan view, an exterior of the apparatus;

FIG. 2 illustrates a cross-section of the apparatus of FIG. 1;

FIG. 3 illustrates a plurality of distributed optical windows through obscure housing material of the apparatus;

FIG. 4 illustrates a plurality of distributed optical windows through housing material of the apparatus that is locally more optically transparent than the rest of the housing material;

FIG. 5 illustrates a plurality of distributed optical windows through housing material of the apparatus that is partially optically transparent throughout;

Figure 7:
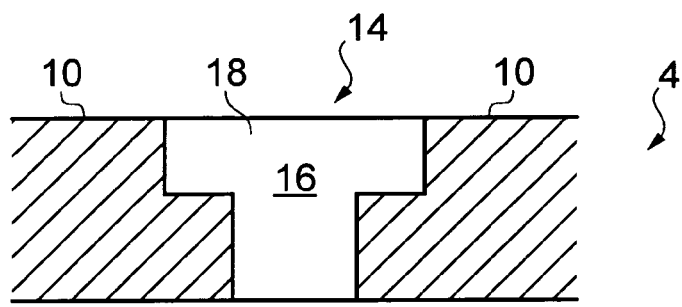
Figure 8:
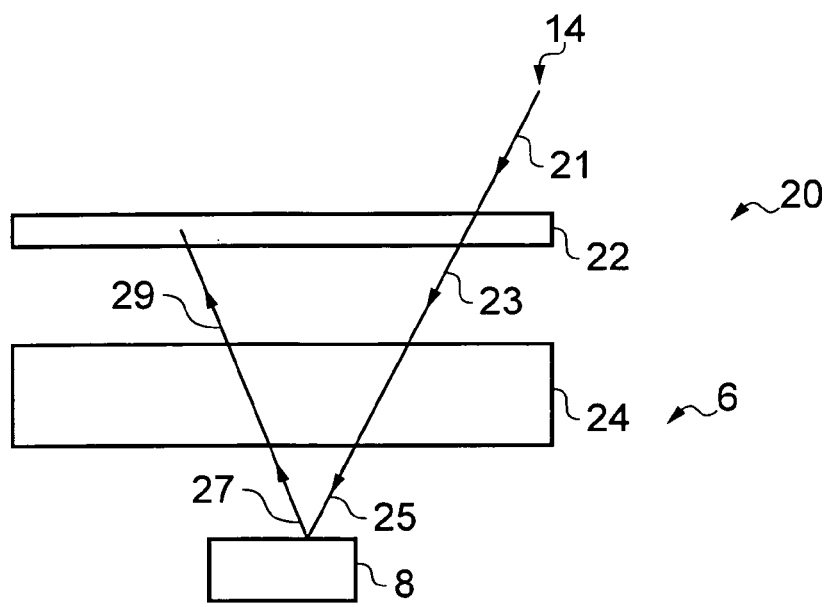
Figure 9:
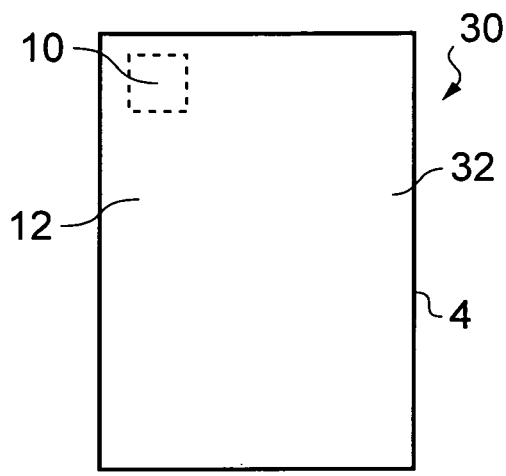
Figure 10:
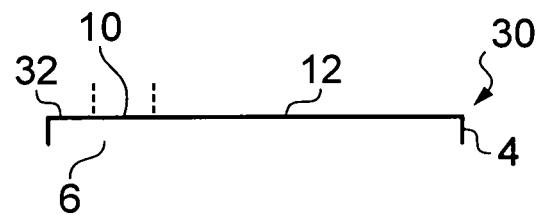

FIG. 7 schematically illustrates an example of an optical window in cross-section;

FIG. 8 illustrates an example of a light valve;

FIG. 9 illustrates, in plan view, an exterior of a front face of a housing part for an apparatus; and FIG. 10 illustrates a cross-section of the housing part illustrated in FIG. 9.

DETAILED DESCRIPTION

The Figures illustrate an apparatus 2 comprising: a housing 4 defining at least one interior cavity 6; at least one optical sensor 8 located within the at least one interior cavity 6 of the housing 4 adjacent a first portion 10 of the housing 4; wherein the first portion 10 of the housing 4 comprises a plurality of distributed optical windows 14 through the housing 4. The optical windows 14 are 'micro-windows'.

FIGS. 1 and 2 illustrate an apparatus 2 that has a plurality of distributed optical windows 14 through a housing 4 to enable an optical sensor 8 within the housing 4 to work without being seen by a user. The windows 14 are not illustrated in FIGS. 1 and 2, however, examples are illustrated in FIGS. 3, 4 and 5.

FIG. 1 illustrates, in plan view, an exterior of the apparatus 2. FIG. 2 illustrates a cross-section of the apparatus 2.

The apparatus 2 may, for example, be an electronic apparatus such as a personal digital assistant, personal media player, mobile cellular telephone, personal computer, a point of sale terminal etc. In some embodiments the apparatus 2 may be a hand-portable apparatus, that is, an apparatus that is sized to be carried in the palm of a hand or in a jacket pocket.

The apparatus 2 comprises a housing 4 defining an interior cavity 6. An optical sensor 8 is located within the interior cavity 6 of the housing 4 adjacent a first portion 10 of the housing 4. In the illustrated example, the first portion 10 of the housing is on a front face of the apparatus 2 but it may be located elsewhere.

The first portion 10 is in register with an optic of the optical sensor 8 as illustrated by the dotted lines. The optic may or may not comprise a lens. It is the sensing circuitry of the optical sensor 8.

The first portion 10 enables light rays to pass from an exterior of the apparatus 2 to the optical sensor 8 sufficiently well that the optical sensor 8 functions properly. The first portion 10 inhibits light rays passing from the optical sensor 8 within the interior cavity 6 of the apparatus 2 sufficiently well that the optical sensor 8 is not visible to a user of the apparatus 2 through the first portion 10

A plurality of distributed optical windows 14 through the housing 4 enable the optical sensor 8 within the housing 4 to work without being seen by a user.

The plurality of distributed optical windows 14 enable more light to pass from an exterior of the apparatus 2 to the optical sensor 8 through the first portion 10 without adversely enabling a user of the apparatus 2 to see the optical sensor 8 through the first portion 10.

The optical sensor 8 may be any suitable optical sensor. There may be a single optical sensor or there may be a plurality of optical sensors. The optical sensor 8 may, for example, be a proximity sensor and/or an ambient light sensor.

FIGS. 3, 4 and 5 illustrate a plurality of distributed optical windows 14 through the housing 4.

An optical window 14 may, for example, be formed by laser ablation. Alternatively, the optical windows 14 may be formed by silk screen printing.

The optical windows 14 are 'micro-windows'. A micro-window 14, according to this document, is an optical window 14 that is sized so that a human user cannot look through the optical window 14 even though light rays can pass through the optical window 14 for sensing. Consequently the optical sensor 8 is not visible (or not clearly visible) through the distributed optical windows and the first portion 10 of the housing appears to a human user of the apparatus 2 as a continuous surface without optical windows.

Each optical window 14 is sized so that it has a minimum dimension that avoids interference effects, for example, the minimum dimension may be greater than 1 μm or even 5 μm or 10 μm.

Figure 6:
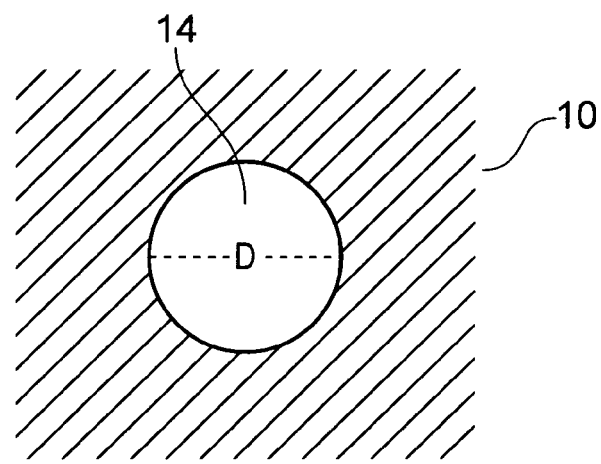
FIG. 6 illustrates an optical window.

Each optical window 14 is sized so that it has a maximum dimension D (FIG. 6) that is not resolvable by the human eye.

The ability of a human eye to resolve an object depends upon the visual acuity of the human eye and the distance of the human eye from the object. Therefore depending upon which parameters are selected for visual acuity and the reference distance of the eye from the optical window 14 different maximum dimensions may be determined. Suitable maximum dimensions D may be, for example 10 μm, 20 μm or 40 μm.

For a visual acuity of 2, a maximum dimension of 36 μm is at the limit of resolution at a distance between the optical window and the human eye of 25 cm. The maximum dimension D may therefore be 36 μm.

The dimensions of an optical window 14 may for example be a value in the range between A μm and B μm, where A is greater than 1 μm and less than 10 μm and B is greater than 10 μm and less than 50 μm.

Each of the optical windows 14 may have the same dimensions. The optical windows 14 may also be elliptical (which includes circular) in shape to avoid diffraction effects caused by corners.

The plurality of optical windows 14 may be uniformly distributed over the first portion 10.

Let us assume that all the optical windows have the same characteristics of size and optical transmission.

Let
$T_w$ be an optical transmission coefficient for the optical windows 14
$A_w$ be the total area of the optical windows 14
$a_w$ be the area of an optical window 14
N be the number of optical windows 14
$T_c$ be an optical transmission coefficient for housing material in the first portion 10 covering the sensor 8
$A_c$ be the total area of the housing material in first portion 10 covering the sensor 8.

T be a target combined optical transmission coefficient for the first portion 10. A be the total area of the first portion 10.

The following equations define the relationship between the parameters:

$$A = A_w + A_c \quad \text{Equation 1}$$

$$T*A = T_w*A_w + T_c*A_c \quad \text{Equation 2}$$

$$A_w = N*a_w \quad \text{Equation 3}$$

T is typically defined by an operational threshold T' of the optical sensor 8. That is T must be equal to or greater than the operational threshold. Therefore Equation 2 can be re-expressed as:

$$T'*A \leq T_w*A_w + T_c*A_c \quad \text{Equation 4}$$

It will therefore be appreciated that an area $A_w$ occupied by the optical windows 14 is dependent upon a transparency $T_w$ of the optical windows 14, an operational threshold T of the optical sensor, and if the housing in the first portion 10 covering the sensor 8 is not optically obscure, it may also be dependent upon the total area $A_c$ of the housing material in first portion 10 covering the sensor 8 and the optical transmission coefficient $T_c$ for the housing material in the first portion 10 covering the sensor 8.

In FIG. 3, the optical windows 14 have been made through an optically obscure housing material. Therefore the housing material between the optical windows is not optically transparent ($T_c=0$).

The housing 4 has a second portion 12 adjacent the first portion 10. The second portion 12 is not adjacent the sensor 8 and does not provide optical windows 14 to the sensor 8. As the optical windows 14 have been made through an optically obscure housing material, the first portion 10 and the second portion 12 are made from the same housing material and have the same optical transparency ($T_c=0$).

The optical windows 14 may be transparent ($T_w=1$), therefore $$A_w = T'*A$$

$$N/A \geq T'/a_w$$

The number and size of the optical windows 14 are dependent upon the operational threshold T' of the optical sensor 8 which is dependent upon the characteristics of the optical sensor 8.

In FIGS. 4 and 5, the optical windows 14 have been made through an optically partially transparent material. Therefore the housing material between the optical windows is partially optically transparent ($T_c>0$).

$$T*A \leq T_w*A_w + T_c*A_c \quad \text{Equation 4}$$

The number and size of the optical windows 14 are in the examples of FIGS. 4 and 5, dependent upon the optical transparency $T_c$ of the housing material at the first portion 10 and the ratio of the area $A_w$ of optical windows 14 to the area $A_c$ of housing material in the first portion 10.

The optical windows 14 may be transparent ($T_w=1$).

The housing material at the first portion 10 may be partially translucent. A value of $T_c=0.1$ or similar means that the optical sensor 8 will not be visible or nearly invisible to a human through the housing material at the first portion 10.

The first portion 10 therefore comprises material between the optical windows 14 that is less than $1/8^{th}$ the optical transparency of the optical windows 14 and, in this example, is of the order $1/10^{th}$ the optical transparency of the optical windows 14. The material between the optical windows 14 may comprise a painted or printed translucent substrate.

Using $T_w=1$ and $T_c=0.1$, $$A_w = (10T'-1)*A/9 \ \& \ N/A = (10T'-1)/9a_w$$

If T'=0.2 (sensor requirement), $A_w=A/9$ and the optical windows 14 occupy of the order of $1/9^{th}$ the area of the first portion 10.

If $a_w/A \sim 10^{-4}$ ($a_w \sim 10^{-9}$ m$^2$ & $A_w \sim 10^{-5}$ m$^2$) then N$\sim 10^3$ and N/A about $10^2$ per mm$^2$.

The number and size of the optical windows 14 are dependent upon T' which is dependent upon the optical sensor 8.

The area occupied by the optical windows 14 is dependent upon a transparency of the optical windows 14 and an operational threshold of the optical sensor 8.

The housing 4 has a second portion 12 adjacent the first portion 10. The second portion 12 is not adjacent the sensor 8 and does not provide optical windows 14 to the sensor 8.

In FIG. 4, the first portion 10 is more optically transparent than the second portion 12. The first portion 10 is a painted or printed partially transparent window. It is sufficiently transparent to allow some light through it to the optical sensor 8 and sufficiently non-transparent to prevent the optical sensor 8 being visible to a user. This partially transparent window has the more optically transparent optical windows 14 through it. A value of $T_c=0.1$ or similar means that the optical sensor 8 will not be visible or nearly invisible to a human through the housing material at the first portion 10.

In this embodiment, it may be important that the first portion 10 is not clearly visible and appears hidden. This may be achieved by reducing the visual contrast between the first portion 10 and the second portion 12 or by decreasing the visual contrast detection sensitivity of the observer by visual design elements in the first portion 10 in the second portion 12. For example, the windows 14 may be spaced in a nonlinear pattern where the number of windows 14 per unit area gradually decreases towards the outer edge of the first portion 10.

In FIG. 5, the first portion 10 and the second portion 12 are partially transparent. Both may be the same, formed from a painted or printed partially transparent substrate. The first portion 10 is sufficiently transparent to allow some light through it to the optical sensor 8 and sufficiently non-transparent to prevent the optical sensor 8 being visible to a user. This partially transparent material has the more optically transparent optical windows 14 through it. A value of $T_c=0.1$ or similar means that the optical sensor 8 will not be visible or nearly invisible to a human through the housing material at the first portion 10. FIG. 7 schematically illustrates an example of an optical window 14 in cross-section. This example of an optical window 14 is a sealed optical window, however, the optical windows 14 do not have to be sealed.

In this example, an aperture 18 through the housing 4 is filled with a sealant 16. The sealant 16 is optically transparent and it has a flat upper surface that is flush with a flat upper surface of the first portion 10 of the housing 4.

The sealant 16 prevents dirt penetrating the optical window 14 which could prevent or reduce optical transmission through the optical window 14.

Referring to FIG. 8, it may also be desirable to have features within the cavity 6 that retain light within the housing 4 that passes through the optical windows 14. If the light is retained within the housing 4 then it is less likely to reflect off the sensor 8 back towards a user.

As an example, light absorbers may be positioned within the cavity 6.

As another example, a light valve 20 may be positioned between the optical windows 14 and the optical sensor 8 within the cavity 6. A light valve 20 allows light to enter through the light valve but it does not allow that light after reflection off the optical sensor 8 to return through the light valve 20.

An example of a light valve 20 is illustrated in FIG. 8. The light valve 20 is positioned between the optical windows 14 and the optical sensor 8. Unpolarized light 21 passes through the optical window 14. The unpolarized light passes through a plane polariser 22 to produce plane polarised light 23 with a polarisation vector that is parallel to a polarisation vector of the plane polariser 22. The plane polarised light 23 passes through a ¼ wave plate which converts the plane polarised light 23 to (clockwise) circularly polarised light 25. The (clockwise) circularly polarised light 25 is reflected off the optical sensor 8 which reverses the polarisation of the circularly polarised light to produce (counter-clockwise) circularly polarised light 27. The (counter-clockwise) circularly polarised light 27 passes through the ¼ wave plate 24 which converts the (counter-clockwise) circularly polarised light 27 to plane polarised light 29 that has a polarisation vector orthogonal to the polarisation vector of the polariser 22. The polariser 22 therefore does not transmit the plane polarised light 29.

The light valve 20 may, for example, be used in combination with any of the configuration of optical windows 14 illustrated in FIG. 3-5.

The preceding description has focused on the apparatus 2 comprising the optical sensor 8. However, the optical windows 14 are features of the housing 4 of the apparatus 2. The optical windows 14 may, for example, be comprised in a housing part that has been connected to the apparatus 2 or has not yet been connected to the apparatus 2 but is designed for connection.

FIGS. 9 and 10 schematically illustrate an example of a housing part 30. The housing part 30 in this example is a front cover for a hand-portable apparatus 2 and when connected to the apparatus 2 forms the apparatus 2 as described with reference to FIGS. 1 and 2. Similar reference numerals are used to denote similar features.

FIG. 9 illustrates, in plan view, an exterior of a front face of the housing part 30 for an apparatus 2. FIG. 10 illustrates a cross-section of the housing part 30 illustrated in FIG. 9.

The housing part 30 comprises a housing wall 32. In this example, the housing wall 32 is for forming a front face of the apparatus 2. The housing wall 32 comprises a plurality of distributed micro-windows 14 through the housing wall 32 as previously described.

The micro-windows 14 are sized so that the housing wall 32 appears to a human user of the apparatus 2 as a continuous surface.

The features described with reference to the apparatus embodiment (FIGS. 1 to 8) are hereby incorporated by reference into this 'housing part' embodiment.

Thus, for example, each micro-window 14 may have a maximum dimension that is less than 40 μm and greater than 1 μm. The micro-windows 14 may be uniformly distributed. Each micro-window 14 may comprise an aperture 18 sealed by translucent material 16.

As described with reference to FIGS. 4 & 5 previously, the housing wall 32 may comprise material between the micro-windows 14 that is optically transparent but has an optical transparency that is less than $⅛^{th}$ the optical transparency of the micro-windows. The housing wall 32 may comprise material between the micro-windows that is of the order $1/10^{th}$ the optical transparency of the micro-windows. As described with reference to FIG. 4, the housing wall 32 may comprise material between the micro-windows 14 that is different to the material of the rest of the housing wall 32. As described with reference to FIG. 5, the housing wall 32 may comprise material between the micro-windows 14 that is the same as the material of the rest of the housing wall 32. The housing wall 32 or a portion of the housing wall 32 may be formed from a painted translucent substrate.

As described with reference to FIG. 3 the housing wall 32 may comprise material between the micro-windows that is optically obscure.

As described with reference to FIG. 8, the housing part 30 may comprise means for retaining light that passes through the micro-windows 14 within the apparatus. For example, the housing part 30 may comprise a light valve 20 positioned and secured adjacent the micro-windows 14 of the housing part 30. A set of housing parts 32 may be manufactured for use with different optical sensors 8. In this scenario, a housing part 30 may be specified for use with a particular optical sensor 8. The number and/or size of the micro-windows 14 for a housing part 30 may dependent upon the specified optical sensor 8.

As used here 'module' refers to a unit or apparatus that excludes certain parts/components that would be added by an end manufacturer or a user. The housing part 30 is a module.

The term 'light' includes light in the visible spectrum for humans and also light in the near infrared spectrum and near ultraviolet spectrum.

The term 'visible light' includes light in the visible spectrum for humans and excludes other light. It excludes light in the near infrared spectrum and near ultraviolet spectrum. Wherever light is used in this document it may be replaced by 'visible light'.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a housing defining at least one interior cavity;
   at least one optical sensor located within the at least one interior cavity of the housing adjacent a first portion of the housing; and
   a light valve comprising a plane polariser and a ¼ wavelength plate;
   wherein the first portion of the housing comprises a plurality of distributed optical windows through the housing, and
   wherein the light valve is positioned between the optical windows and the optical sensor such that the light valve allows light to enter the cavity through the light valve but it does not allow that light after reflection off the optical sensor to return through the light valve.

2. An apparatus as claimed in claim 1, wherein the optical windows are sized so that the optical sensor is not visible to a human user of the apparatus through the distributed optical windows.

3. An apparatus as claimed in claim 1, wherein the optical windows are sized so that the first portion of the housing appears to a human user of the apparatus as a continuous surface.

4. An apparatus as claimed in claim 1, wherein each optical window has a maximum dimension that is less than 40 µm and greater than 1 µm.

5. An apparatus as claimed in claim 1, wherein the optical windows are uniformly distributed.

6. An apparatus as claimed in claim 1, wherein the optical windows occupy of the order of ⅛th the area of the first portion.

7. An apparatus as claimed in claim 1, wherein each optical window comprises an aperture sealed by translucent material.

8. An apparatus as claimed in claim 1, wherein the first portion is in register with an optic of the sensor.

9. An apparatus as claimed in claim 8, wherein the first portion comprises material between the optical windows that is of the order $1/10^{th}$ the optical transparency of the optical windows.

10. An apparatus as claimed in claim 8, wherein the housing has a second portion adjacent the first portion wherein the second portion is not adjacent the sensor and does not provide optical windows to the sensor, wherein the first portion and the second portion have the same optical transparency.

11. An apparatus as claimed in claim 8, wherein the housing has a second portion adjacent the first portion wherein the second portion is not adjacent the sensor and does not provide optical windows to the sensor, wherein the first portion is more optically transparent than the second portion.

12. An apparatus as claimed in claim 1, wherein the optical sensor is selected from the group consisting of: a proximity sensor and an ambient light sensor.

13. An apparatus as claimed in claim 1, wherein each optical window is sized so that it has a minimum dimension that avoids interference effects and
   wherein the optical windows may be elliptical or circular in shape to avoid diffraction effects caused by corners.

14. A housing part of an apparatus comprising:
   a housing wall comprising a plurality of distributed micro-windows through the housing wall;
   an optical sensor; and
   a light valve comprising a plane polarizer and a ¼ wavelength plate,
   wherein the light valve is positioned between the plurality of micro-windows and the optical sensor such that the light valve allows light to enter the housing through the light valve but it does not allow that light after reflection off the optical sensor to return through the light valve.

15. A housing part of an apparatus as claimed in claim 14, wherein each micro-window has a maximum dimension that is less than 40 µm and greater than 1 µm.

16. A housing part of an apparatus as claimed in claim 14, wherein each micro-window comprises an aperture sealed by translucent material.

17. A housing part of an apparatus as claimed in claim 14, wherein the housing wall is formed from a painted translucent substrate.

18. A housing part of an apparatus as claimed in claim 14, configured as a front cover for a hand-portable apparatus.

19. A set of housing parts of apparatuses, wherein each housing part is a housing part as claimed in claim 14, wherein each housing part is for use with a specified optical sensor and wherein a number and/or size of the micro-windows for a housing part is dependent upon the specified optical sensor.

* * * * *